(12) United States Patent
Vasoya et al.

(10) Patent No.: US 6,869,664 B2
(45) Date of Patent: Mar. 22, 2005

(54) LIGHTWEIGHT CIRCUIT BOARD WITH CONDUCTIVE CONSTRAINING CORES

(75) Inventors: Kalu K. Vasoya, Santa Ana, CA (US); Bharat M. Mangrolia, Santa Ana, CA (US); William E. Davis, Huntington Beach, CA (US); Richard A. Bohner, Hermosa Beach, CA (US)

(73) Assignee: ThermalWorks, Inc., Huntington Beach, CA (US)

( * ) Notice: Subject to any disclaimer, the term of this patent is extended or adjusted under 35 U.S.C. 154(b) by 0 days.

(21) Appl. No.: 10/020,506

(22) Filed: Dec. 11, 2001

(65) Prior Publication Data

US 2002/0157859 A1 Oct. 31, 2002

Related U.S. Application Data

(60) Provisional application No. 60/254,997, filed on Dec. 12, 2000.

(51) Int. Cl.$^7$ .............................................. B32B 15/00
(52) U.S. Cl. .................... 428/209; 428/901; 428/299.1; 428/301.1; 428/301.4; 428/469; 428/702; 428/323; 442/110; 442/11; 174/250; 174/257; 174/261
(58) Field of Search ................................ 442/110, 111; 174/250, 257, 261; 428/209, 901, 299.1, 301.1, 301.4, 469, 702, 323

(56) References Cited

U.S. PATENT DOCUMENTS

| | | | |
|---|---|---|---|
| 4,299,873 A | 11/1981 | Ogihara et al. | |
| 4,318,954 A | 3/1982 | Jensen | |
| 4,591,659 A | 5/1986 | Leibowitz | |
| 4,689,110 A | 8/1987 | Leibowitz | |
| 4,812,792 A | 3/1989 | Leibowitz | |
| 4,888,247 A | * 12/1989 | Zweben et al. | ............. 428/105 |
| 5,004,639 A | 4/1991 | Desai | |
| 5,326,636 A | * 7/1994 | Durand et al. | ............. 428/323 |
| 6,013,588 A | 1/2000 | Ozaki | |
| 6,016,598 A | 1/2000 | Middelman et al. | |

FOREIGN PATENT DOCUMENTS

| | | |
|---|---|---|
| EP | 0313961 A2 | 5/1989 |
| WO | WO 95/02505 A1 | 1/1995 |
| WO | WO 97/17199 A1 | 5/1997 |

OTHER PUBLICATIONS

Supplemental European Search Report dated Apr. 30, 2004 from corresponding European Appl. No. EP 01 99 0176, filed Dec. 11, 2001.

Translation of WO–97/17199–A1.

* cited by examiner

*Primary Examiner*—Deborah Jones
*Assistant Examiner*—Ling Xu
(74) *Attorney, Agent, or Firm*—Christie, Parker & Hale, LLP

(57) ABSTRACT

Prepregs, laminates, printed wiring board structures and processes for constructing materials and printed wiring boards that enable the construction of printed wiring boards with improved thermal properties. In one embodiment, the prepregs include substrates impregnated with electrically and thermally conductive resins. In other embodiments, the prepregs have substrate materials that include carbon. In other embodiments, the prepregs include substrates impregnated with thermally conductive resins. In other embodiments, the printed wiring board structures include electrically and thermally conductive laminates that can act as ground and/or power planes.

15 Claims, 15 Drawing Sheets

LIGHTWEIGHT CIRCUIT BOARD WITH CONDUCTIVE CONSTRAINING CORES

CROSS-REFERENCE TO RELATED APPLICATION(S)

The present application claims priority on the basis of the provisional patent application Ser. No. 60/254,997, filed Dec. 12, 2000, and entitled "LIGHTWEIGHT MULTIPLE LAYER PRINTED WIRING BOARD."

STATEMENT REGARDING FEDERALLY SPONSORED RESEARCH OR DEVELOPMENT

Certain portions of the background technology to the present invention were made under one or more of the following United States Government Contracts: NAS 3-27743; NAS 3-97040; and F 29601-94-C-0093. Accordingly, the United States Government may have some rights.

BACKGROUND OF THE INVENTION

Multiple-layer printed circuit boards or printed wiring boards (PWBs) are used for mounting integrated circuits (ICs) and other components. The push to decrease circuit size and weight and to operate at higher frequencies and clock speeds has led to smaller components generating greater heat and being placed more closely together on the PWB. Additional size and speed improvements have also been achieved by reducing the footprints of the components by using leadless chip carriers.

The greater density of components on the PWBs and hotter components resulted in thermal management problems. The Coefficient of Thermal Expansion ("CTE") mismatch between the PWBs and the components becomes more important when greater temperatures are generated. CTE mismatch between the PWBs and components can result in fracture or fatigue during the thermal cycling caused by powering on and off of electronic devices. Leadless chip carriers are especially susceptible to disengagement from the PWB when there are CTE mismatches. Solder joints and connections tend to pull apart in the "tug-of-war" introduced by the CTE mismatch.

Prior PWB designs have used metal constraining layers or cores, such as copper-invar-copper, aluminum or steel, to lower the board's CTE. However, these materials add undesirable weight. U.S. Pat. No. 4,318,954 to Jensen provides an example of a PWB design for use in cycling thermal environments that uses lightweight carbon based constraining layers to lower the board's CTE. U.S. Pat. No. 4,591,659 to Leibowitz also demonstrates that carbon constraining layers can serve as thermal conductors for carrying heat away from the components mounted on the PWB in addition to lowering the board's CTE. U.S. Pat. No. 4,318,954 to Jensen and U.S. Pat. No. 4,591,659 to Leibowitz are incorporated by reference in their entirety to the present disclosure.

The ability of previous PWBs to conduct heat away from the components mounted on their surfaces is limited by the prepreg used to prevent electrical conductivity between the functional layers of the PWB. The materials used in prepreg have poor thermal conduction properties. Therefore, the ability of the carbon constraining layer to conduct heat away from the surface of the board was limited by the amount of prepreg between it and the surface of the board. The carbon material used in the carbon constraining layers is electrically conductive, which required the functional layers of the PWB in prior structures to be electrically insulated from the carbon constraining layers in order to prevent short circuits and cross talk. In previous designs, this requirement places a lower limit on the distance between the carbon constraining layers and the surface of the board equivalent to the minimum amount of prepreg required to insulate the functional layers of the board from each other and from the carbon constraining layers. This lower limit translated into an upper limit on the amount of heat that could be conducted away from the surface of the PWB. Accordingly there was a need for a PWB that possessed mechanical strength with a low CTE and that exceeds the upper limit on the amount of heat that can be conducted away from the surface of the PWB which was inherent in previous designs.

SUMMARY OF THE INVENTION

In one aspect, the invention relates to a structure and method in which a thermally conductive layer is provided in a PWB or a portion thereof. For example, the invention may include a prepreg layer made of a substitute impregnated with a resin which is thermally conductive, and possibly also electrically conductive. A laminate may be formed from such a prepreg layer, the laminate having first and second metallic layers positioned above and below the prepreg. Alternatively, the laminate may itself be thermally and/or electrically conductive, enabling its use in a high performance printed wiring board.

DETAILED DESCRIPTION OF THE INVENTION

Figure 10:
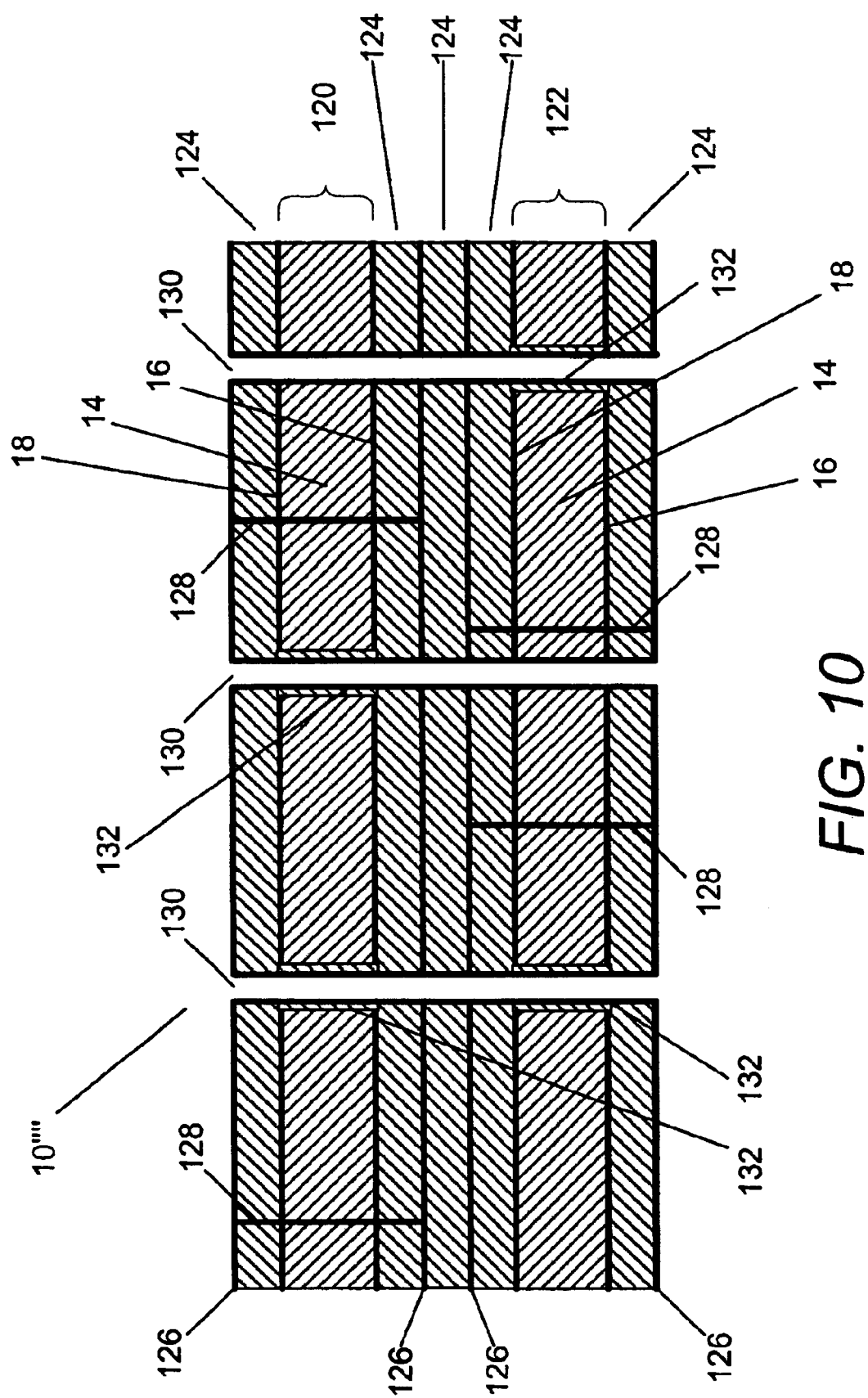
FIG. 10 is a semi-schematic cross-sectional view showing a PWB in accordance with the present invention including two electrically and thermally conductive laminates and a number of chimneys and plated through holes.

Referring now to the drawings, a printed wiring board ("PWB") 10"" in accordance with an embodiment of the present invention is shown in FIG. 10. The PWB includes a first laminate 120, and a second laminate 122, multiple layers of prepreg 124 and multiple layers of metal 126. The PWB 10"" contains circuits and is used for mounting integrated circuits (ICs) and components. The term circuit is used to describe an electrically conductive path between two or more points. Individual layers of the PWB can include circuits and a number of circuits on several layers of the PWB can be connected to create an overall PWB circuit. The layers on which circuits are located are often referred to as functional layers.

The laminates 120 and 122 comprise a carbon containing layer 14 sandwiched between a first layer of metal or other electrically conductive material 16 and a second layer of metal or other electrically conductive material 18. Both of the laminates 120 and 122 are electrically conductive, which enables the laminate to be used as a functional layer within the PWB. The functions that can be performed by the laminates include acting as a ground plane within the PWB, a power plane within a PWB or both a ground and power plane in the PWB where routing is used to electrically isolate portions of the laminate. Various examples of other laminate structures that can be used in accordance with the present invention to implement the laminates 120 and 122 are discussed below.

The layers of metal can act as functional layers in the PWB. In one embodiment, the layers of metal or other electrically conductive material are patterned with electrical circuits. Electrical contact between the various layers of metal or laminates can result in the functions of the electrical circuits patterned onto the layers of metal being interrupted. Therefore, prepregs are used to electrically insulate the electrically conductive laminates 120 and 122 and the layers of metal 126.

A prepreg is a composite layer that includes a substrate or supporting material composed of fibrous material that is impregnated with resin. The prepregs are electrical insulators having dielectric constants less than 6.0 at 1 Hz. A prepreg may also be a film. A film is a type of prepreg that does not include a substrate but is instead a composite that only includes resins. Materials that can be used to construct prepregs in accordance with the present invention are discussed below.

Often, the circuits within a PWB include plated "through holes" to establish connections between the functional layers of the PWB. In one embodiment, the PWB 10"" includes through holes 130 lined with electrically conductive material that are used to establish electrical connections between the functional layers in the PWB. These lined through holes enable electrical signals to pass between circuits on the metal layers and/or the laminates. It is well known in the art that connections can be created between the electrically conductive linings of plated through holes and circuits patterned on a layer of metal by locating the plated through hole such that the lining of the plated through hole contacts a portion of the circuit patterned on the layer of metal. When a connection between a laminate and a plated through hole is desired, the through hole is simply drilled through the laminate at the desired location and an electrical connection is established where the electrically conductive lining of the through hole contacts the electrically conductive laminate.

Techniques for avoiding electrical connections between circuits patterned on a layer of metal in a PWB and a plated through hole are well known in the art. Each of the options essentially involves designing the circuit routings and the locations of the plated through holes to avoid contact between the electrically conductive lining of the plated through hole and the circuit. Where connections between the plated through holes and the first or second laminates are not desired, then an annulus of dielectric material 132 such as an epoxy resin with a dielectric constant less than 6.0 at 1 MHz can be used to ensure that an electrical connection does not exist between the laminate and the electrically conductive lining of the through hole.

Figure 11A:
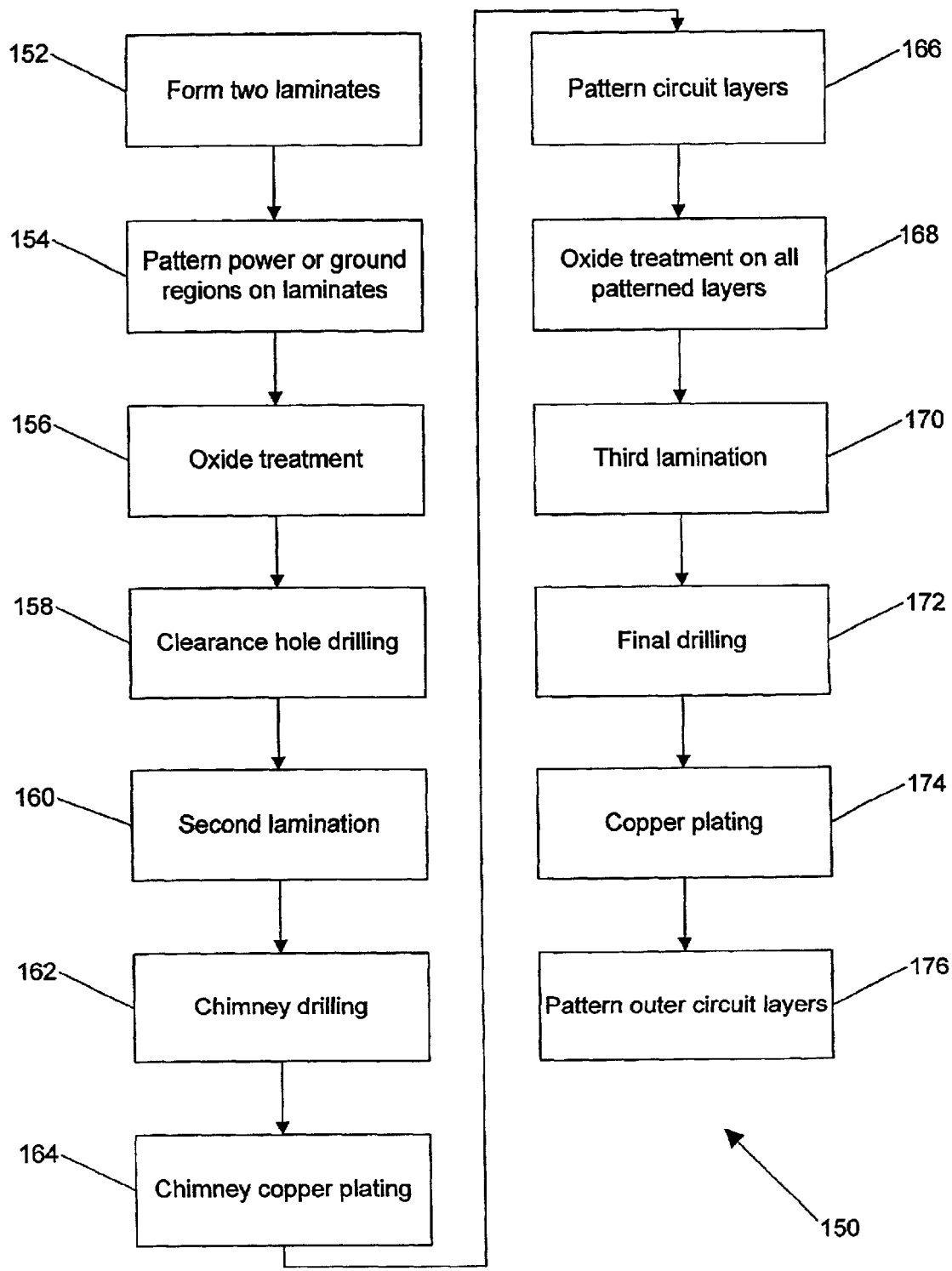
FIG. 11A is a flow chart illustrating a process for manufacturing a PWB in accordance with the present invention including multiple electrically and thermally conductive laminates, chimney holes and plated through holes.

A process in accordance with the present invention for manufacturing the PWB 10"" illustrated in FIG. 10 is shown in FIG. 11A. The process 150 commences with the step 152, which involves constructing two laminates in accordance with the present invention using any of the appropriate processes described below including the process illustrated in FIG. 2A. Power or ground regions are then patterned on the laminates in the step 154.

Once the patterning is complete, the laminates are subjected to oxide treatment in the step 156. After oxide treatment, clearance hole drilling is performed in the step 158. Clearance hole drilling involves drilling holes in the laminate of a first diameter and filling the resulting holes with a dielectric material such as any of the resins described below with a dielectric constant less than 6.0 at 1 MHz. Prior to filling the drilled holes, they are inspected and cleaned using high pressure dry air.

Once the clearance holes have been drilled, the second lamination cycle is performed in the step 160. The second lamination cycle is similar to the second lamination cycle described below in relation to FIG. 2A. After the second lamination cycle, circuits are etched onto the layers of metal that will be located within the interior of the finished PWB are patterned in the step 166 and then subjected to oxide treatment in the step 168.

Following the oxide treatment, the third lamination step is performed in the step 170. The third lamination involves aligning the two structures produced in the second lamination with additional prepreg layers to correspond with the layers of the PWB 10"" illustrated in FIG. 10. The layers are then exposed to temperatures and pressures similar to those experienced during the second lamination cycle.

After the third lamination cycle, the final through hole drilling is performed in step 172. The final through hole drilling involves drilling holes through the entire PWB that have a second diameter, which is less than the first diameter described above. The through holes are then lined in the step 174. Preferably, the through holes are lined with copper. In other embodiments, the through holes can be plated with materials similar to those that can be used in the construction of the layers of metal. If a through hole passes through one of the filled clearance holes in a laminate, then the lining of the through holes are electrically isolated from the laminate in which the clearance hole is drilled. If a through hole does not pass through one of the filled clearance holes in a laminate, then the lining of the through holes is in electrical contact with the laminate.

Figure 2A:
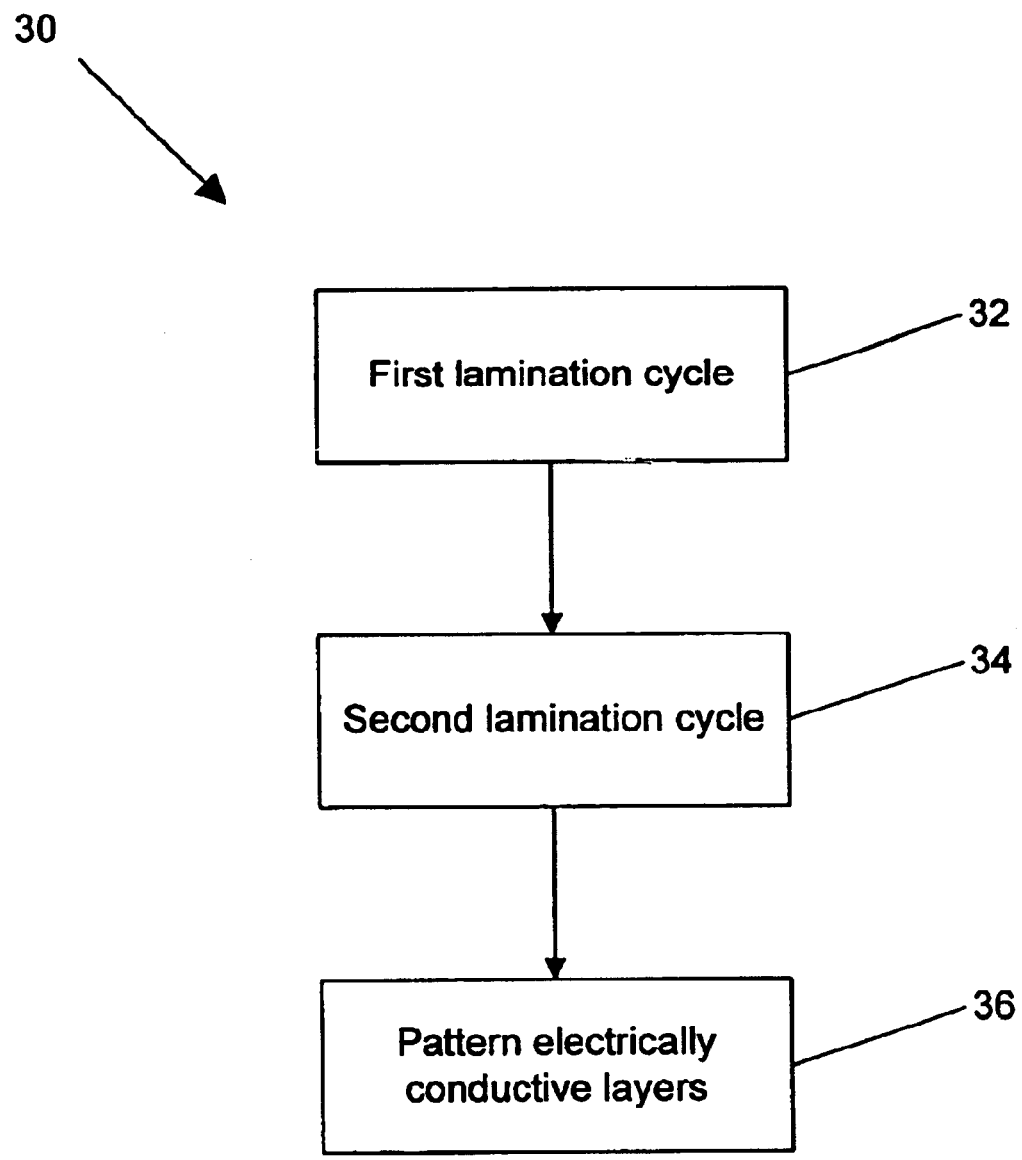
FIG. 2A is a flow chart illustrating a process for constructing a PWB in accordance with the present invention.
Figure 2B:
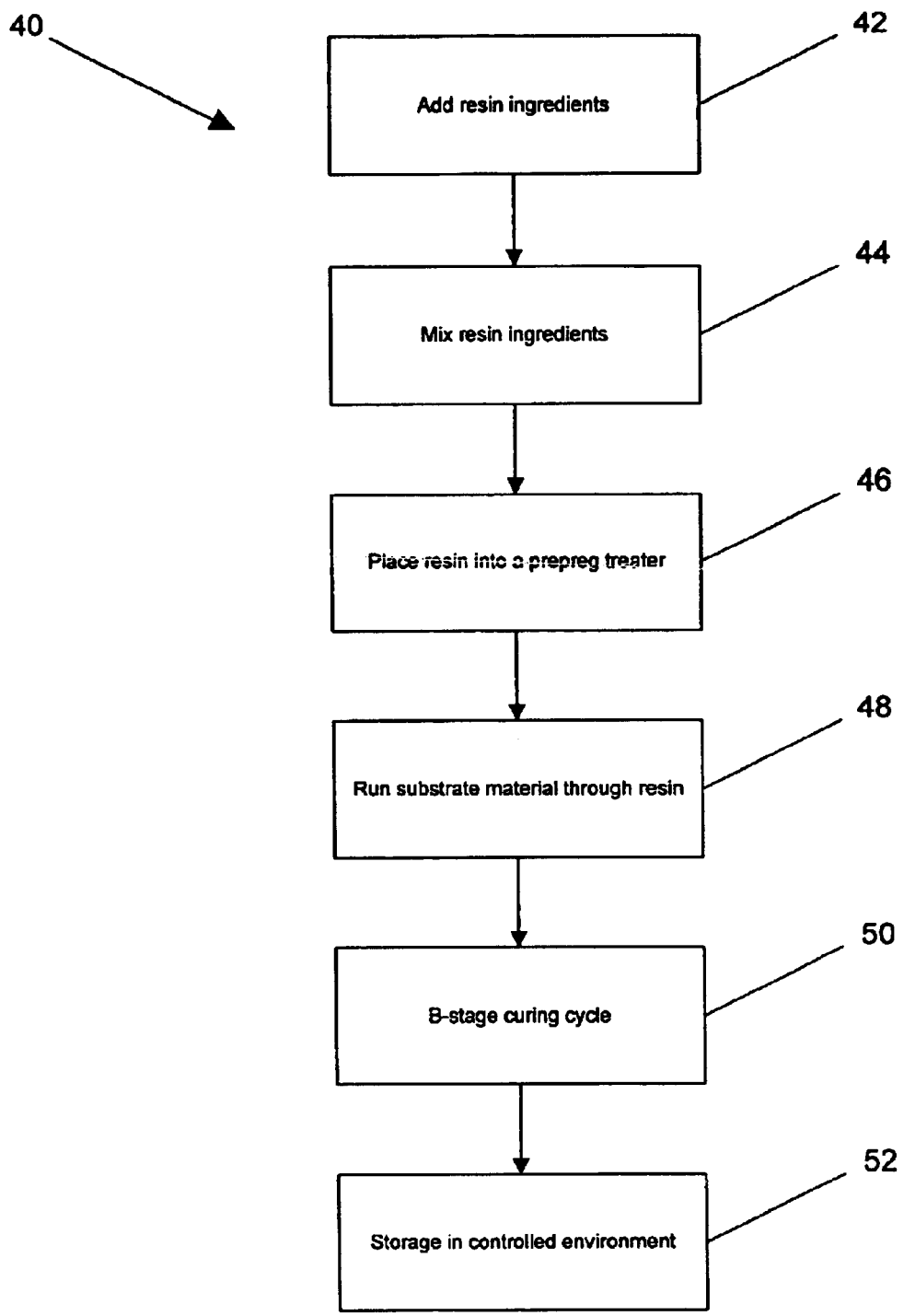
FIG. 2B is a flow chart illustrating a process for impregnating a substrate with resin in accordance with the present invention.

One preferred embodiment of a process 40 for impregnating a layer containing carbon constructed from woven carbon fiber with an electrically conductive resin is illustrated in FIG. 2B. The first step in the process 42 involves adding together ingredients to form a resin. Most resins are formed using epoxy or polyimide solid state resin, solvent, acetones, catalysts and additives. Typically, the properties of a particular resin are determined by the various additives included in the resin and the quantities of these additives. Additives can be used to increase the electrical conductivity or the thermal properties of a resin. When an additive is used to increase the electrical or thermal conductivity of a resin, the thermal or electrical conductivity of a resin increases with the amount of the additive mixed through the resin. In one preferred embodiment, an amount of pyrolitic carbon in powder form equal to 10% by weight of the resin is added as an ingredient to increase the electrical conductivity and thermal properties of the resin. In other embodiments, any amount of pyrolitic carbon can be added to improve the thermal and electrical properties of the resin. Preferably, the amount of pyrolitic carbon added to the resin is between 5% to 50% by weight of the resin. The various resin ingredients are then mixed in the step 44 to form a substantially homogenous resin.

Once a resin is formed, the resin is placed in a prepreg treater in the step 46. The prepreg treater is used to impregnate a substrate with resin. In the next step 48, the substrate to be impregnated is passed through the prepreg treater. In one preferred embodiment of the process, the substrate material is woven carbon fibers such as the woven carbon fiber materials described above. In one preferred embodiment using a woven carbon fiber substrate, the substrate is impregnated with 45% by weight resin. In other embodiments, the substrate is impregnated with between 5% to 80% by weight resin.

Once the substrate has been passed through the prepreg treater, the B-stage curing cycle is performed in the step 50. The B-stage curing cycle involves exposing the substrate and resin to a temperature of between 250° F. to 300° F. The amount of time that the substrate and resin are exposed to this temperature is determined by the amount of resin loaded onto the substrate and the extent of curing required. In one preferred embodiment, a time period of 15 minutes is required for the impregnation of a woven carbon fiber substrate with 45% resin cured to B-stage so that it is suitable for use in the process described above in relation to FIG. 2A. Upon the completion of the B-stage curing cycle, the resin is stored in a controlled environment prior to use in the step 52.

In other embodiments, silver oxide particles are used as a resin additive to increase the electrical conductivity and thermal properties of the resin. In one preferred embodiment, an amount of silver oxide equal to 40% by weight of the resin is added. In other embodiments, any amount of silver oxide can be added to increase the thermal properties of the resin. Preferably, the amount of silver oxide added to the resin will be between 5% and 70% by weight of the resin.

In other embodiments, boron nitride particles are used as a resin additive to increase the thermal properties of the resin. In one preferred embodiment, an amount of boron nitride equal to 40% by weight of the resin is added. In other embodiments, any amount of boron nitride can be added to increase the thermal properties of the resin. Preferably, the amount of boron nitride added to the resin will be between 5% and 70% by weight of the resin.

In other embodiments, diamond particles are used as a resin additive to increase the thermal properties of the resin. In one preferred embodiment, an amount of diamond particles equal to 15% by weight of the resin is added. In other embodiments, any amount of diamond particles can be added to increase the thermal properties of the resin. Preferably, the amount of diamond particles added to the resin will be between 2% to 50% by weight of the resin.

In other embodiments, aluminum oxide particles are used as a resin additive to increase the thermal properties of the resin. In one preferred embodiment, an amount of aluminum oxide equal to 40% by weight of the resin is added. In other embodiments, any amount of aluminum oxide can be added to increase the thermal properties of the resin. Preferably, the amount of aluminum oxide added to the resin will be between 5% to 70% by weight of the resin. In other embodiments, two or more of the additives described above can be used as additives to form a resin.

In other embodiments, prepregs can be manufactured using the above process by using substrate materials that have dielectric constants less than 6.0 at 1 MHz. In one preferred embodiment, a fiberglass substrate is impregnated with a resin containing boron nitride to produce a thermally conductive prepreg with a dielectric constant less than 6.0 at 1 MHz. Preferably, the fiberglass is impregnated with 70% by weight resin. In other embodiments, the fiberglass is impregnated with between 20% and 80% by weight resin.

In other embodiments, other substrates such as kevlar, quart, aramid or any other material or mixture of materials having a dielectric constant less than 6.0 at 1 MHz, a glass transition temperature greater than 250° F., a thermal conductivity greater than 0.1 W/m.K, a CTE between −4.5 ppm/° C. and 30 ppm/° C., high tensile strength and high thermal endurance can be used in the construction of prepreg layers. Preferably, the substrate material has a glass transition temperature greater than 400° F., a CTE between −4.5 ppm/° C. and 12 ppm/° C., retains 50% to 60% of its strength at 700° F. and has a dielectric constant less than 3.0 at 1 Mhz. Prepreg manufactured using this process can be used in the construction of the first and second prepreg layers of the PWB 10 in accordance with the present invention illustrated in FIG. 1.

In other embodiments, the layer containing carbon is impregnated with a resin that is thermally conductive such as a epoxy or polyimide based boron nitride resin, epoxy or polyimide based aluminum oxide, epoxy or polyimide based ceramic resin, epoxy or polyimide based diamond particles resin or any other resin having properties similar to the electrically and thermally conductive resins described above except that the dielectric constant of the resin is less than 6.0 at 1 Mhz.

In other embodiments, the layer containing carbon is constructed from a sheet of unidirectional carbon fiber such as unidirectional K13C2U manufactured by Mitsubishi Chemical America, Inc. and having a thickness of 0.001 inches. The unidirectional carbon fiber material chosen for use in the construction of the carbon containing layer preferably has properties similar to those described above for the woven carbon fiber that can be used in the construction of the layer containing carbon.

In other embodiments, the sheet of unidirectional carbon fiber is impregnated with resin. Resins with similar properties to those described above in relation to embodiments of laminates incorporating sheets of woven carbon fiber can also be used to impregnate sheets of unidirectional carbon fiber used in the construction of laminates in accordance with the present invention.

In other embodiments, multiple layers of unidirectional carbon fiber that are aligned such that the fibers in each of the layers are substantially parallel can be used in the construction of the layer containing carbon.

Figure 3:
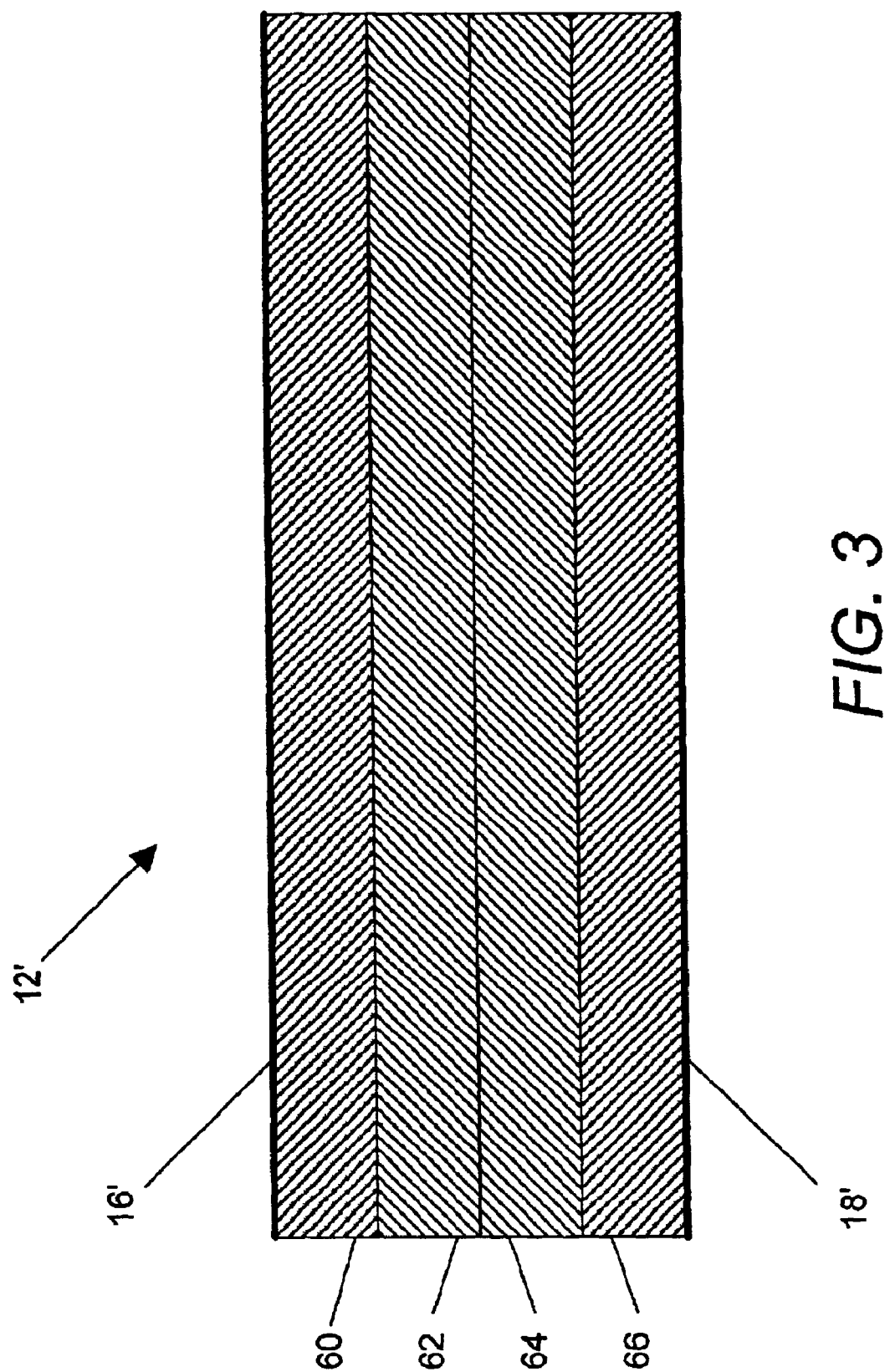
FIG. 3 is a semi-schematic cross-sectional view showing a laminate incorporating four layers of unidirectional carbon fibers.

One preferred embodiment of a laminate 12' constructed in accordance with the present invention using four unidirectional layers of carbon fiber is illustrated in FIG. 3. In this embodiment, the laminate is constructed from a first unidirectional layer of carbon fiber 60, a second unidirectional layer of carbon fiber 62, a third unidirectional layer of carbon fiber 64 and a fourth unidirectional layer of carbon fiber 66. Each of the unidirectional layers of carbon fiber have the same thickness and fiber area weight. The first and fourth unidirectional layers of carbon fiber are constructed so that the carbon fibers in each layer are aligned to be substantially parallel. The second and third unidirectional layers of carbon fiber are constructed from sheets of unidirectional carbon fiber, where the fibers are aligned substantially perpendicular to the carbon fibers in the first and fourth layers.

Figure 4:
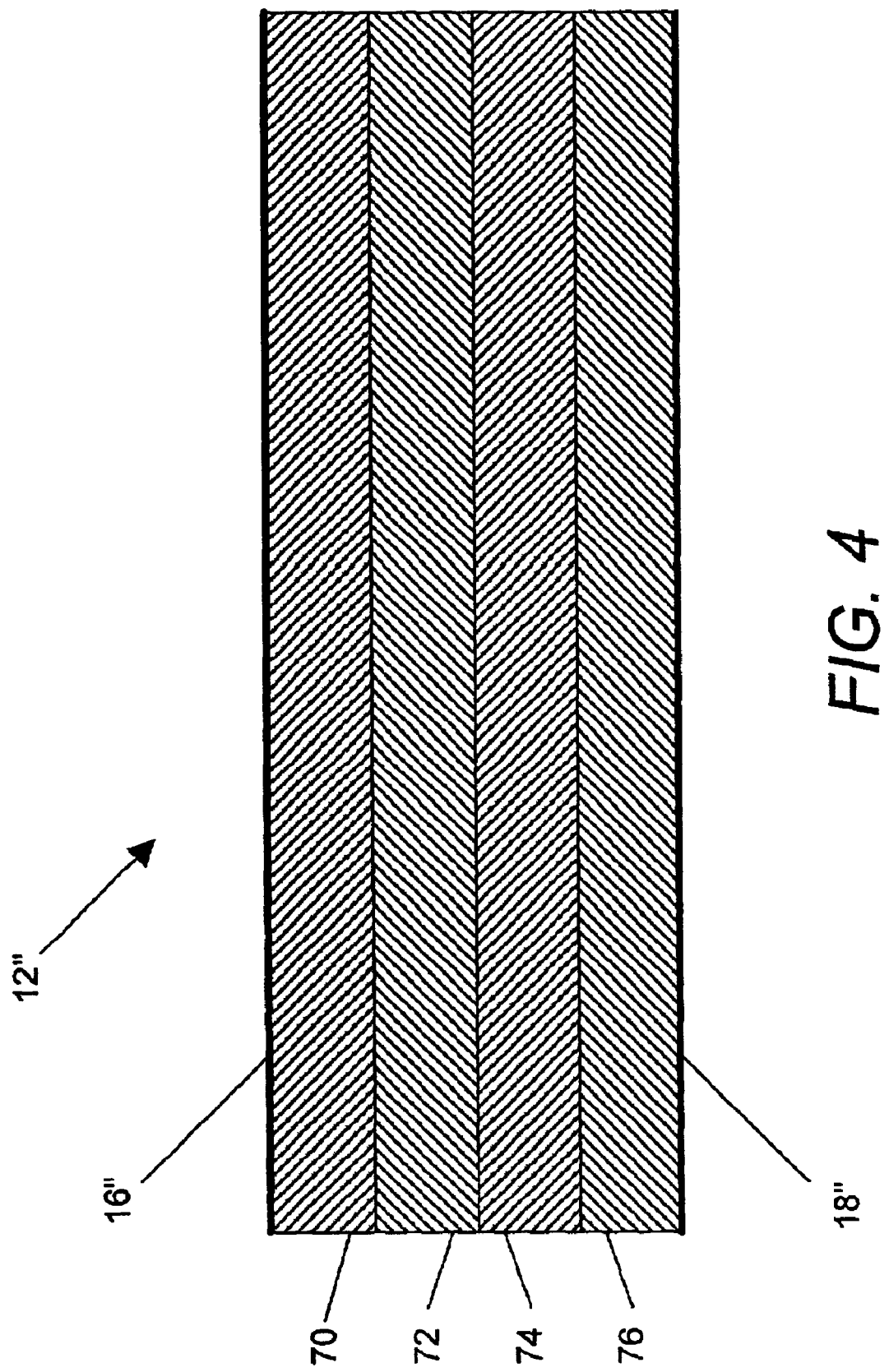
FIG. 4 is a semi-schematic cross-sectional view showing another embodiment of a laminate incorporating four layers of unidirectional carbon fibers.

Another preferred embodiment of a laminate 12" constructed in accordance with the present invention using unidirectional layers of carbon fiber are illustrated in FIG. 4. In this embodiment the laminate 12" is constructed from a first unidirectional layer of carbon fiber 70, a second unidirectional layer of carbon fiber 72, a third unidirectional layer of carbon fiber 74 and a fourth unidirectional layer of carbon fiber 76. Each of the unidirectional layers of carbon fiber have the same thickness and fiber area weight. The first and third unidirectional layers of carbon fiber are constructed from sheets of unidirectional carbon fiber having fibers aligned in substantially the same direction. The second and fourth unidirectional layers of carbon fiber are constructed from sheets of unidirectional carbon having fibers aligned in a direction substantially perpendicular to the direction in which the fibers in the first and third unidirectional layers of carbon fiber are aligned.

Figure 5:
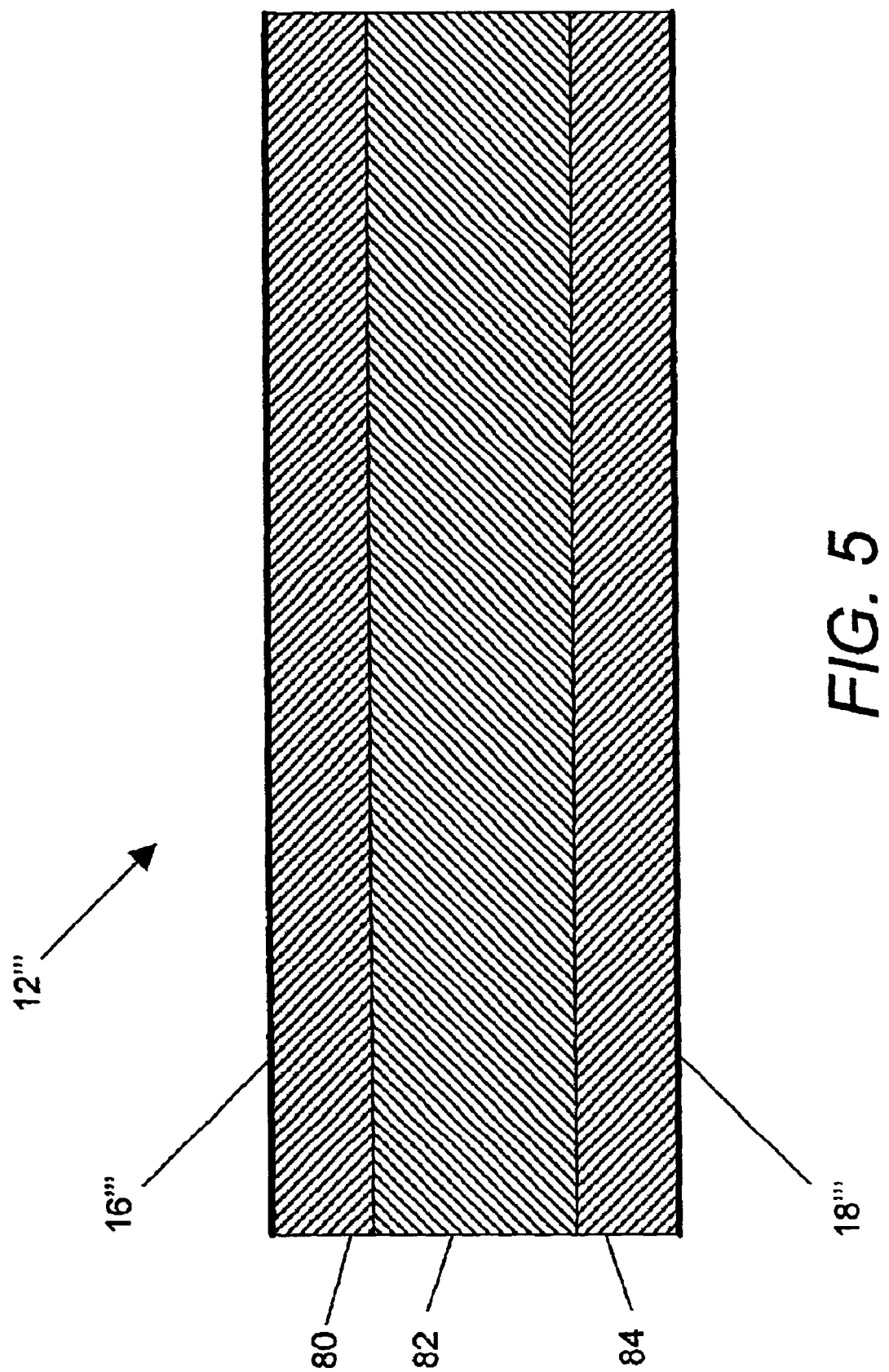
FIG. 5 is a semi-schematic cross-sectional view showing a laminate incorporating three layers of unidirectional carbon fibers.

Another preferred embodiment of a laminate 12''' constructed in accordance with the present invention using unidirectional layers of carbon fiber are illustrated in FIG. 5. In this embodiment the laminate 12''' is constructed from a first unidirectional layer of carbon fiber 80 having a thickness of 0.002 inches, a second unidirectional layer of carbon fiber 82 having a thickness of 0.004 inches and a third unidirectional layer of carbon fiber 84 having a thickness of 0.002 inches. The fiber area weight of the first and third unidirectional layers of carbon fiber have the same fiber area weight, which is half the fiber area weight of the second unidirectional layer of carbon fiber. The first and third unidirectional layers of carbon fiber are constructed from sheets of unidirectional carbon fiber having fibers aligned in the same direction. The second unidirectional layer of carbon fiber is constructed from a sheet of unidirectional carbon having fibers aligned in a direction perpendicular to the direction in which the fibers in the first and third unidirectional layers of carbon fiber are aligned.

In other embodiments, a number of layers of unidirectional carbon fiber greater than four can be used in the construction of the printed circuit board provided that the layer containing carbon fiber is balanced.

Figure 6:
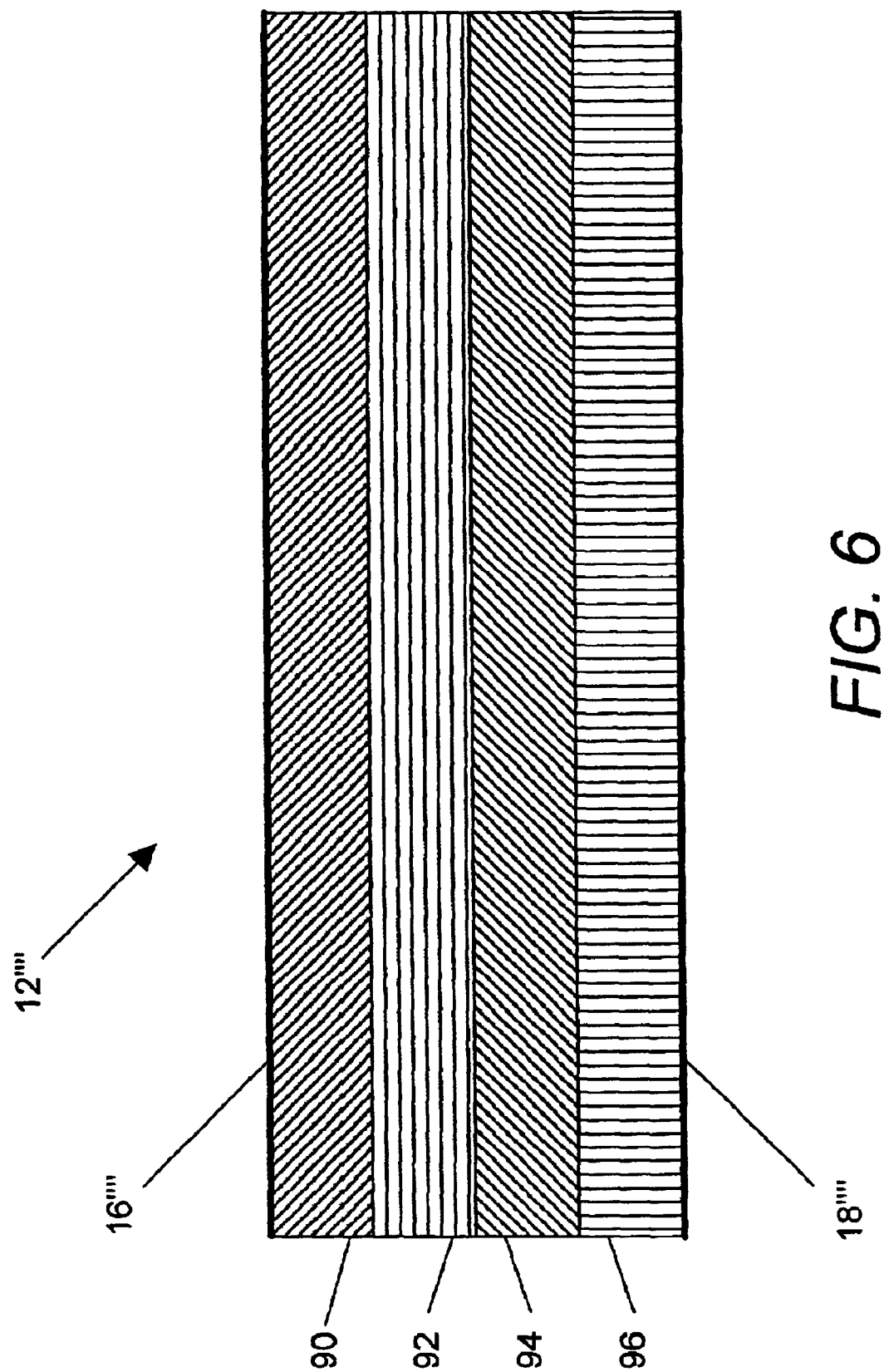
FIG. 6 is a semi-schematic cross-sectional view showing a laminate incorporating four layers of unidirectional carbon fibers in an isotropic configuration.

In other embodiments, laminates in accordance with the present invention include layers containing carbon that are substantially isotropic. One embodiment of a laminate in accordance with the present invention incorporating an isotropic carbon containing layer is illustrated in FIG. 6. The laminate 12'''' includes a first unidirectional layer of carbon fiber 90 constructed from a sheet of unidirectional carbon fiber with fibers aligned in a first reference direction, a second unidirectional layer of carbon fiber 92 constructed from a sheet of unidirectional carbon fiber positioned so that its fibers are aligned at an angle of 45° to the first reference direction, a third unidirectional layer of carbon fiber 94 constructed from a sheet of unidirectional carbon fiber positioned so that its fibers are aligned at an angle of 90° to the first reference direction and a fourth unidirectional layer of carbon fiber 96 constructed from a sheet of unidirectional carbon fiber positioned so that its fibers are aligned at an angle of 135° to the first reference direction. The sheets of unidirectional carbon fiber can be impregnated with resins similar to those resins described above.

Figure 7:
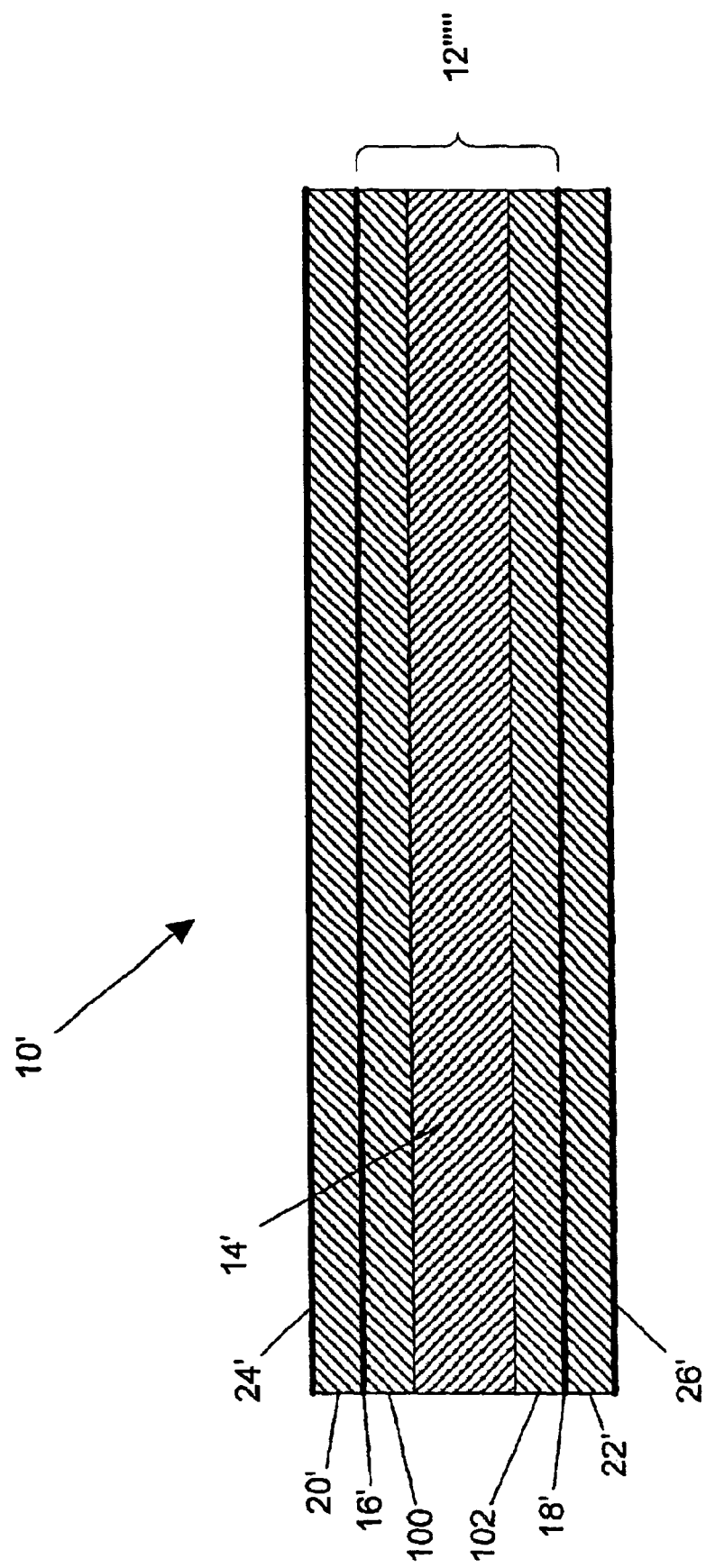
FIG. 7 is a semi-schematic cross-sectional view showing a PWB in accordance with the present invention including a laminate incorporating prepreg layers.

A PWB in accordance with the present invention is illustrated in FIG. 7. The PWB 10' includes a laminate structure 12'''' having a carbon containing layer 14' positioned between a first layer of prepreg 100 and a second layer of prepreg 102. A first layer of metal 16' is positioned above the first prepreg layer and a second layer of metal 18' is positioned beneath the second prepreg layer. A third layer of prepreg 20' is positioned above the first layer of metal and a second layer of prepreg 22' is positioned below the second layer of metal. A third layer of metal 24' is positioned above the third layer of prepreg and a fourth layer of metal 26' is positioned below a fourth layer of prepreg.

Figure 1:
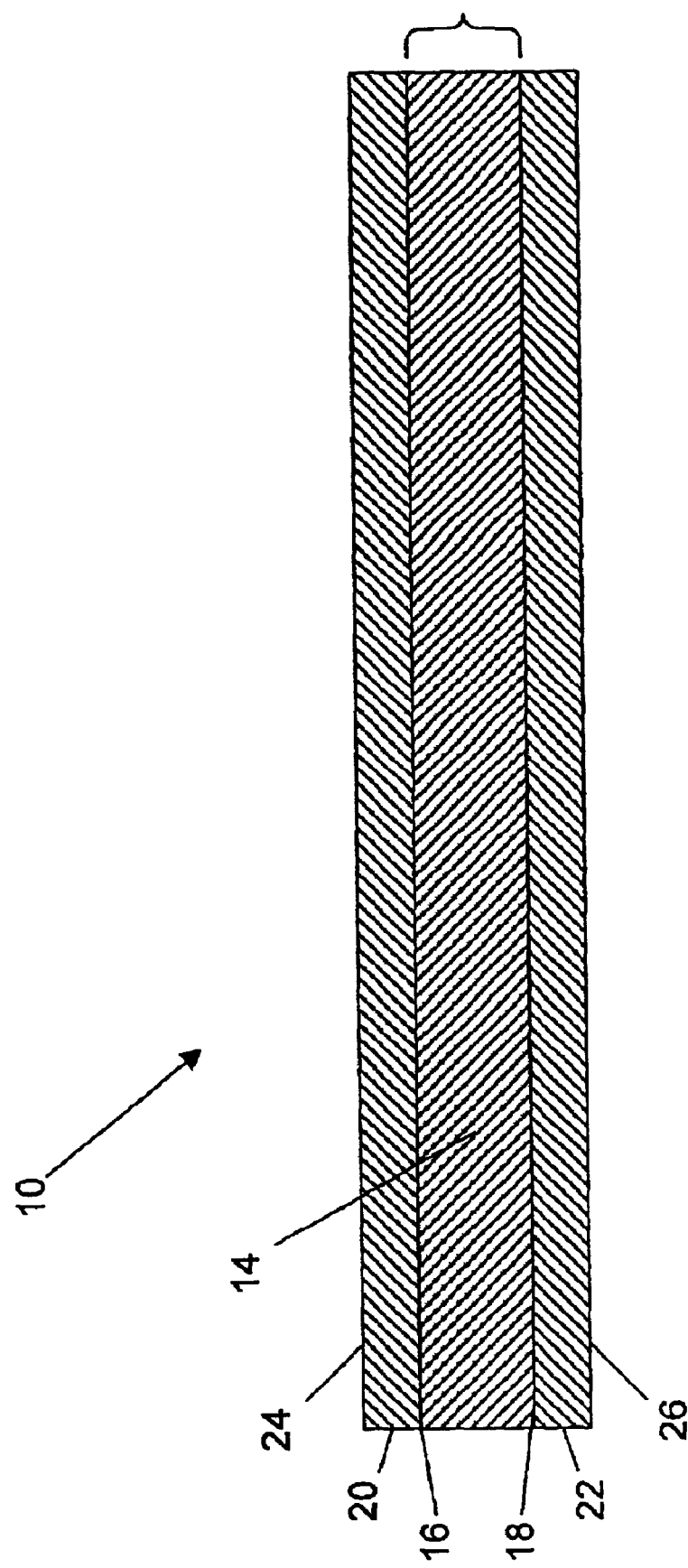
FIG. 1 is a semi-schematic cross-sectional view showing a PWB in accordance with the present invention including an electrically and thermally conductive laminate.

In one preferred embodiment, the layer containing carbon 14' is constructed from a woven sheet of carbon fiber and the layers of metal are constructed from materials similar to those described above in the construction of the layers of metal used in the construction of the embodiment of the PWB shown as 10 in FIG. 1. In addition, third and fourth prepreg layers are constructed from materials similar to those described above in the construction of the first and second prepreg layers of the embodiment of the PWB shown as 10 in FIG. 1.

In one preferred embodiment an electrically and thermally conductive prepreg layer such as epoxy based pyrolitic carbon resin prepreg manufactured in accordance with the process described above in relation to FIG. 2B, and having properties similar to the pyrolitic carbon resin described above, is used in the construction of the first and second prepreg layers. An electrically and thermally conductive prepreg is used in the construction of the first and second prepreg layers to ensure that an electrically conductive path exists between the layer containing carbon and the first and second electrically conductive layers. In other embodiments, other electrically and thermally conductive prepregs such as polyimide based pyrolitic carbon resin prepreg, epoxy or polyimide based silver oxide resin prepreg or any other prepreg having a glass transition temperature greater than 100° F., low moisture absorption, high resistance to chemical corrosion, high resistance to micro cracking, high structural durability, controlled flow, good adhesion, a thermal conductivity greater than 0.2 W/m.k and a dielectric constant greater than 6.0 at 1 Mhz can be used in the construction of the first and second prepreg layers. Preferably, the first and second prepreg layers are constructed from a prepreg having a glass transition temperature greater than 250° F. and a thermal conductivity greater than 2.0 W/m.k.

The method of manufacturing the PWB 10' illustrated in FIG. 7 is similar to the method illustrated in FIG. 2A. A layer of epoxy based pyrolitic carbon resin prepreg is placed on one side of a layer of woven carbon fibers and a second layer of epoxy based pyrolitic carbon resin prepreg is placed on the other side of the layer of woven carbon fiber. Layers of ¼ oz copper foil are then placed on the outside surfaces of the layers of epoxy based pyrolitic carbon resin prepreg. These layers are then subjected to the first lamination cycle as described above in relation to FIG. 2A to produce the laminate 12"". The second lamination cycle and the patterning of the PWB 10' are also similar to processes described above in relation to FIG. 2A.

In other embodiments, thermally conductive prepreg layers similar to those used in the construction of the first and second prepreg layers of the embodiment of the PWB 10 shown in FIG. 1, as described above, can be used in the construction of the first and second prepreg layers of the embodiment of the PWB 10' shown in FIG. 7. In embodiments of the PWB 10' that use thermally conductive prepreg layers that are poor conductors of electricity, electrical contacts are made between the first and second layers of metal and the carbon containing layer by plated through holes. Plated through holes are holes drilled through the laminate 12"" that are lined with electrically conductive material and establish electrical contacts between the first and second layers of metal and the layer containing carbon.

In other embodiments, the laminate 12"" is constructed from a layer containing carbon made from layers of unidirectional carbon fibers that have arrangements similar to the arrangements described above in relation to the embodiments of laminates in accordance with the present invention illustrated in FIGS. 3–6. In other embodiments, the layers of unidirectional carbon fibers are impregnated with resins similar to those described above prior to the construction of the laminate 12"".

In other embodiments, the laminate 12"" is constructed from a layer containing carbon that is made from a carbon composite sheet or plate such as a carbon plate manufactured by Mitsubishi Chemical America, Inc having a thickness of 0.001 inches. A carbon composite sheet or plate can be constructed using a compressed powder mold. In other embodiments, the layer containing carbon can be constructed from any carbon composite sheet or plate has physical properties similar to those described above in relation to woven carbon fiber.

For embodiments of the laminate 12"" constructed using layers containing carbon made from carbon composite sheets or plates, the first layer of prepreg 100 and the second layer of prepreg 102 can be constructed from resins similar to those described above.

Figure 8:
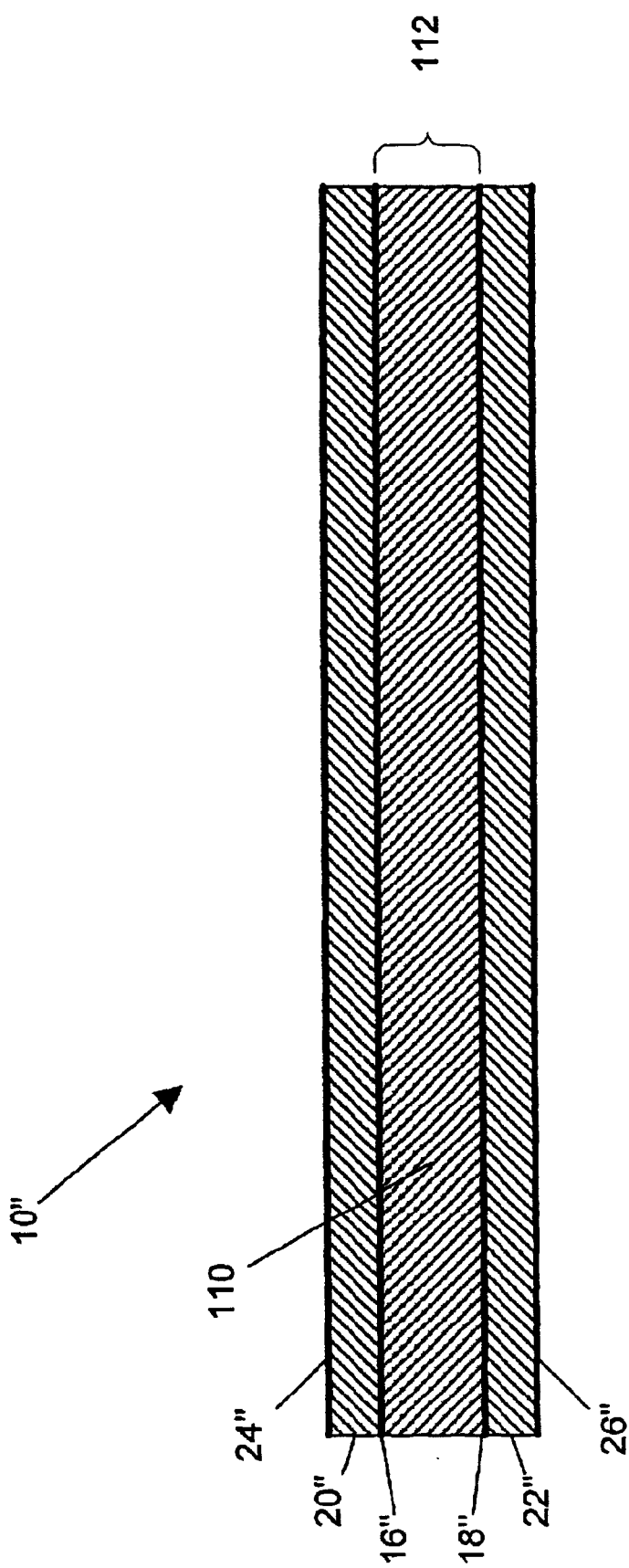
FIG. 8 is a semi-schematic cross-sectional view showing a PWB in accordance with the present invention including an electrically and thermally conductive laminate including a fiber glass layer impregnated with electrically and thermally conductive resin.

A PCB in accordance with the present invention is illustrated in FIG. 8. The PCB 10" includes an electrically and thermally conductive layer 110. A first layer of metal 16" is positioned above the electrically and thermally conductive layer and a second layer of metal 18" is positioned below the electrically and thermally conductive layer. A first prepreg layer 20" is positioned above the first layer of metal and a second prepreg layer 22" is positioned below the second layer of metal. A third layer of metal 24" is positioned above the first prepreg layer and a fourth layer of metal 26" is positioned below the second prepreg layer. The electrically and thermally conductive layer and the first and second layers of metal form an electrically conductive laminate 112.

In one preferred embodiment, similar materials to those that can be used in the construction of the embodiment of the PWB 10 in accordance with the present invention illustrated in FIG. 1 can also be used in the construction of the first and second prepreg layers and the first, second, third and fourth layers of metal. In one preferred embodiment, the third and fourth layers of metal are patterned to contain electrical circuits.

In one preferred embodiment, the electrically and thermally conductive layer is constructed from a woven fiberglass substrate impregnated with an electrically conductive epoxy pyrolitic carbon resin in accordance with the process described above in relation to FIG. 2B. Preferably, the woven fiberglass used in the construction of the electrically and thermally conductive layer is E-glass manufactured by JPS Glass located at South Cickering of Ontario in Canada. In other embodiments, other substrate materials such as non-woven fiberglass, kevlar, quartz, aramid or other materials having a glass transition temperature greater than 250° F., a thermal conductivity greater than 0.1 W/m.K, a CTE between −4.5 ppm/° C. and 30 ppm/° C., high tensile strength and high thermal endurance. Preferably, the substrate has a glass transition temperature greater than 400° F., a CTE between −4.5 ppm/° C. and 12 ppm/° C., retains 50% to 60% of its strength at 700° F. Preferably, the fiberglass substrate is impregnated with 70% by weight resin of an epoxy resin containing 10% by weight pyrolitic carbon additive. In other embodiments, the electrically and thermally conductive layer is formed using a substrate that is impregnated with between 5% to 80% of any of the resins described above having a dielectric constant greater than 6.0 at 1 MHz. In other embodiments, any resin and substrate combination can be used that results in the electrically and thermally conductive layer 14' having a dielectric constant greater than 6.0 at 1 Mhz.

The embodiment of the PWB 10" illustrated in FIG. 8 can be manufactured in accordance with the processes illustrated in FIG. 2A and FIG. 2B.

Figure 9:
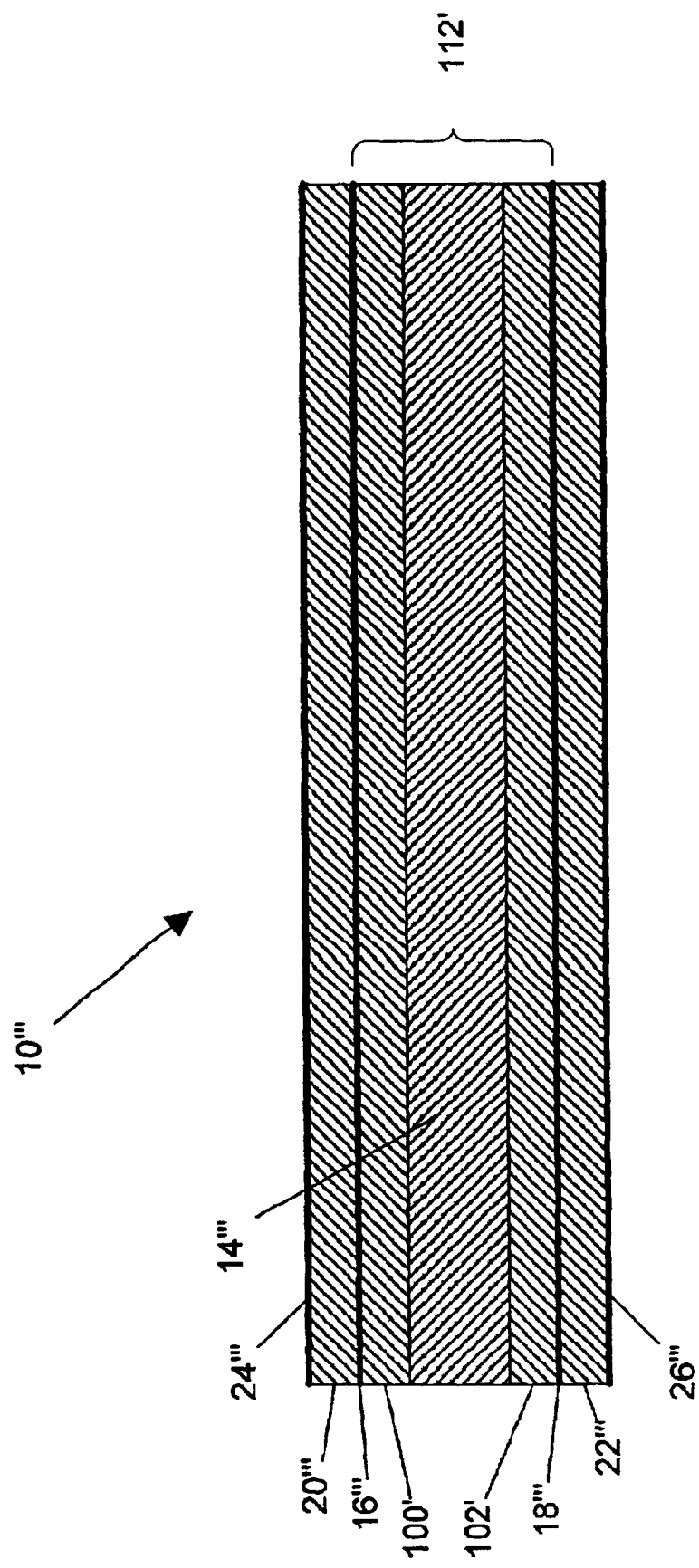
FIG. 9 is a semi-schematic cross-sectional view showing a PWB in accordance with the present invention including an electrically and thermally conductive laminate having a fiber glass layer impregnated with electrically and thermally conductive resin contained within layers of prepreg.

An embodiment of a PWB in accordance with the present invention is illustrated in FIG. 9. The PWB 10''' is similar to the PWB 10' illustrated in FIG. 7 except that the carbon containing layer is replaced with any of the substrate materials described above and that the first and second prepreg layers possess dielectric constants greater than 6.0 at 1 MHz.

The embodiments of PWBs described above have utilized a single laminate. In other embodiments of PWBs in accordance with the present invention, multiple laminates can be used.

A PWB in accordance with the present invention including two laminates is illustrated in FIG. 10. The PWB 10"" includes a first laminate 120, a second laminate 122, multiple layers of prepreg 124 and multiple layers of metal 126. In one preferred embodiment, the first laminate forms a ground plane and the second laminate forms a power plane. In other embodiments, the function of the laminates can be reversed, both laminates can share the same functions or the laminates can be utilized for their improved thermal properties only. The use of multiple laminates can increase the ability of the PWB to conduct heat away from its surface, improve the CTE of the PWB and can decrease the thickness and weight of the PWB, when compared to prior art PWBs.

In one preferred embodiment, the first laminate 120 and second laminate 122 are constructed similarly to the laminate 12 of FIG. 1. In other embodiments any of the laminate structures described above can be used in the construction of the first or second laminate. Preferably, the layers of prepreg 124 and layers of metal are constructed from materials similar to those that can be used to construct the prepreg layers and the layers of metal in the PWB 10 illustrated in FIG. 1. In other embodiments any of the laminates described above can be used in the construction of the first and second laminates.

A closer inspection of FIG. 10 reveals that the PWB 10"" includes a number of plated holes. The PWB 10"" includes chimneys 128 that are holes filled with thermally conductive material. The chimneys are used to transport heat from the surface of the PWB to the electrically and thermally conductive laminates within the PWB. The chimneys do not extend all the way through the PWB. If the chimneys contacted both the first and second laminates, then the chimneys could short circuit the PWB. The PWB 10"" also includes through holes 130 lined with electrically conductive material that are used to establish electrical connections between the functional layers in the PWB. Where connections between the plated through holes and the first or second laminates are not desired, then an annulus of dielectric material 132 such as an epoxy resin with a dielectric constant less than 6.0 at 1 MHz can be used to ensure that an electrical connection does not exist between the laminate and the electrically conductive lining of the through hole.

A process in accordance with the present invention for manufacturing the PWB 10"" illustrated in FIG. 10 is shown in FIG. 11A. The process 150 commences with the step 152, which involves constructing two laminates in accordance with the present invention are formed using the process described above in relation to FIG. 2A. Power or ground regions are then patterned on the laminates in the step 154. The patterning electrically isolates regions within the laminate, which can enable laminate to function as a ground or power plane within a PWB.

Once the patterning is complete, the laminates are subjected to oxide treatment in the step 156. After oxide treatment, clearance hole drilling is performed in the step 158. Clearance hole drilling involves drilling holes in the laminate of a first diameter and filling the resulting holes with a dielectric material such as any of the resins described above with a dielectric constant less than 6.0 at 1 MHz. Prior to filling the drilled holes, they are inspected and cleaned using high pressure dry air.

Once the clearance holes have been drilled, the second lamination cycle is performed in the step 160. The second lamination cycle is similar to the second lamination cycle described above in relation to FIG. 2A. After the second lamination cycle, chimney holes are drilled into the PWB in the step 162. Once the chimney holes have been drilled, the linings of the chimney holes are lined with a thermally conductive material in the step 164. Preferably, the thermally conductive material is copper. In other embodiments, any material with a thermal conductivity greater than 5 W/m.K can be used.

After the chimney holes have been lined, circuits are etched onto the layers of metal that will be located within the interior of the finished PWB are patterned in the step 166 and then subjected to oxide treatment in the step 168.

Following the oxide treatment, the third lamination is performed in the step 170. The third lamination involves aligning the two structures produced in the second lamination with additional prepreg layers to correspond with the layers of the PWB 10"" illustrated in FIG. 10. The layers are then exposed to temperatures and pressures similar to those experienced during the second lamination cycle.

After the third lamination cycle, the final through hole drilling is performed in step 172. The final through hole drilling involves drilling holes through the entire PWB that have a second diameter, which is less than the first diameter described above. The through holes are then lined in the step 174. Preferably, the through holes are lined with copper. In other embodiments, the through holes can be plated with materials similar to those that can be used in the construction of the layers of metal. If a through hole passes through one of the filled clearance holes in a laminate, then the lining of the through holes are electrically isolated from the laminate in which the clearance hole is drilled. If a through hole does not pass through one of the filled clearance holes in a laminate, then the lining of the through hole is in electrical contact with the laminate.

Figure 11B:
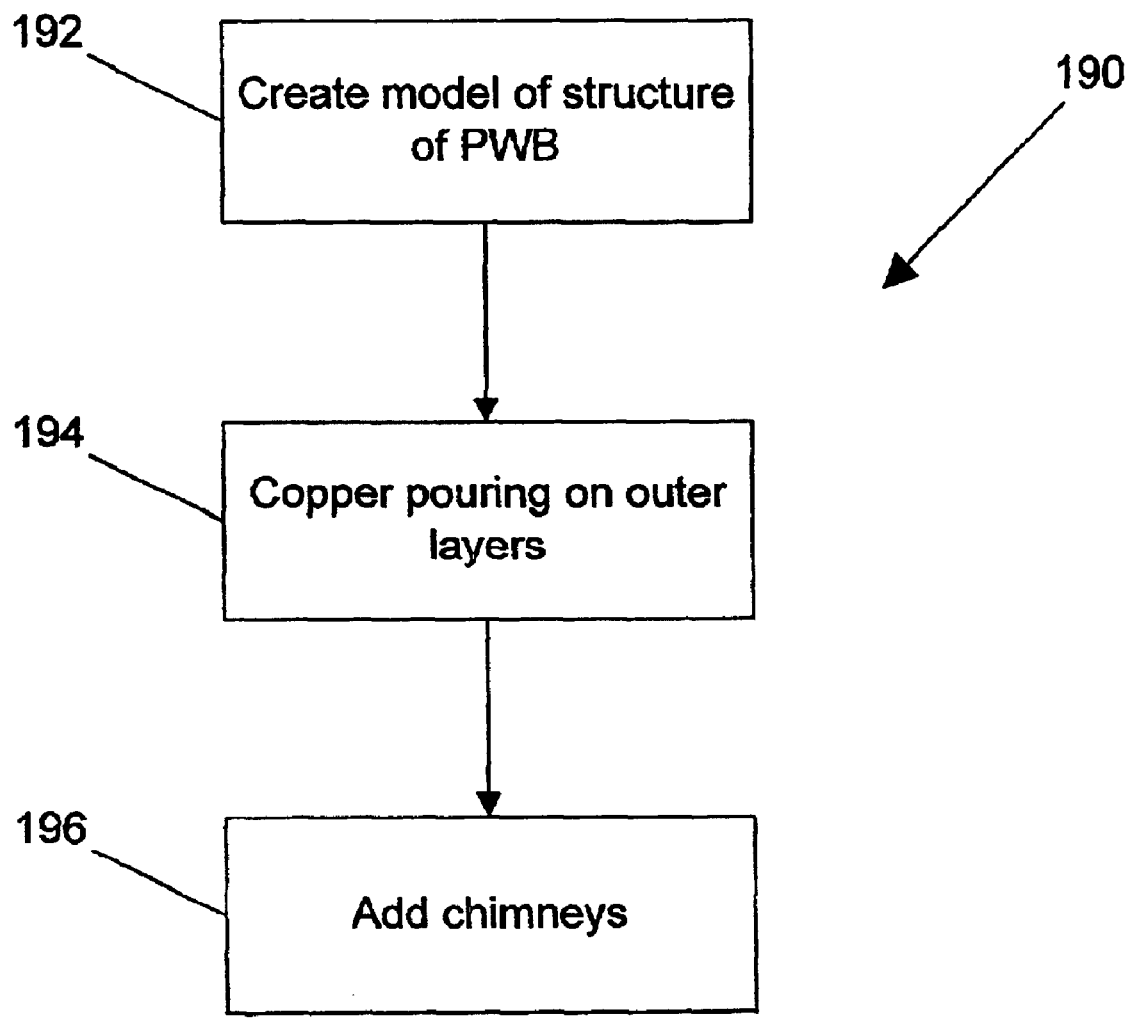
FIG. 11B is a flow chart illustrating a process for determining locations in which to drill chimney holes in a PWB.

An embodiment of a process for selecting the locations in which to drill chimney holes in a PWB is illustrated in FIG. 11B. The process 190 includes a first step 192, which involves creating a model of the structure of the PWB. The second step 194 involves adding a thermally conductive material such as copper to the outermost layers of metal on the model. The thermally conductive material is added to the model such that the thermally conductive material does not create any electrical contacts with the circuits patterned onto the layers of metal on which the thermally conductive material is added.

Once the thermally conductive material has been added, the locations of the chimney holes are determined in the step 196. The locations of the chimney holes are determined by choosing a location on the surface of the PWB that lies within an area where thermally conductive material was added during step 194. The location is a suitable location for a chimney if a hole of a specified diameter corresponding to the diameter of the chimney can be drilled through the PWB without intersecting any of the electrical circuits patterned onto layers of metal internal to the PWB. Otherwise, the chosen location is unsuitable as a location for drilling a chimney hole. The number of locations that must be found is dependent upon the amount of heat required to be conducted away from the surface of the board.

Figure 11C:
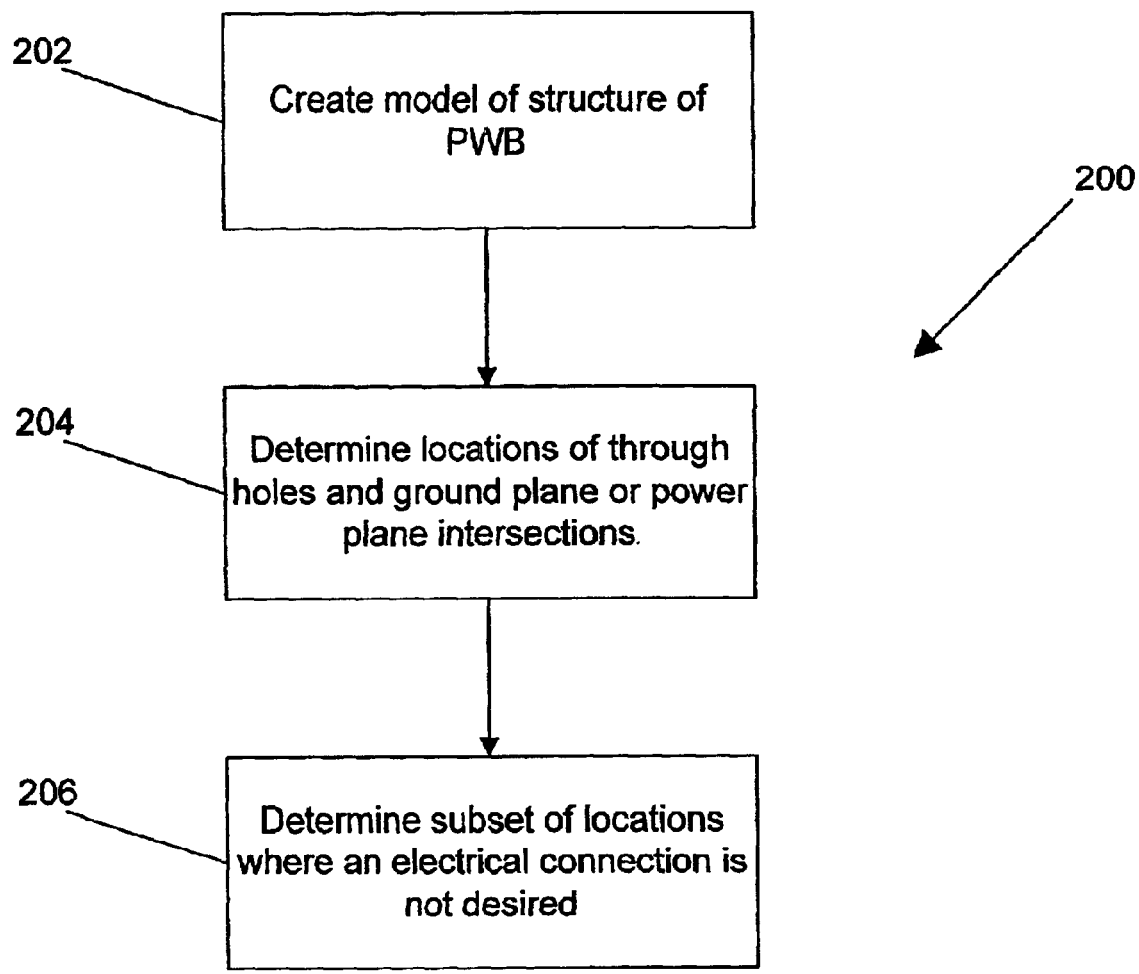
FIG. 11C is a flow chart illustrating a process for determining locations in which to drill filled clearance holes in electrically and thermally conductive laminates during the construction of a PWB in accordance with the present invention.

An embodiment of a process for selecting the location of the filled clearance holes in the laminates is illustrated in FIG. 11C. The process 200 includes a first step 202, which involves constructing a model of the PWB. The locations of the through holes in the PWB are used to determine the locations in which the through holes intersect the ground plane laminate or the power plane laminate in the step 204. Once these locations have been determined, the locations of the clearance holes are chosen in the step 206 as the locations where the through holes intersect the ground or power plane laminates and where an electrical connection between the lining of the plated through hole and the ground or power plane laminate is undesirable.

Figure 12:
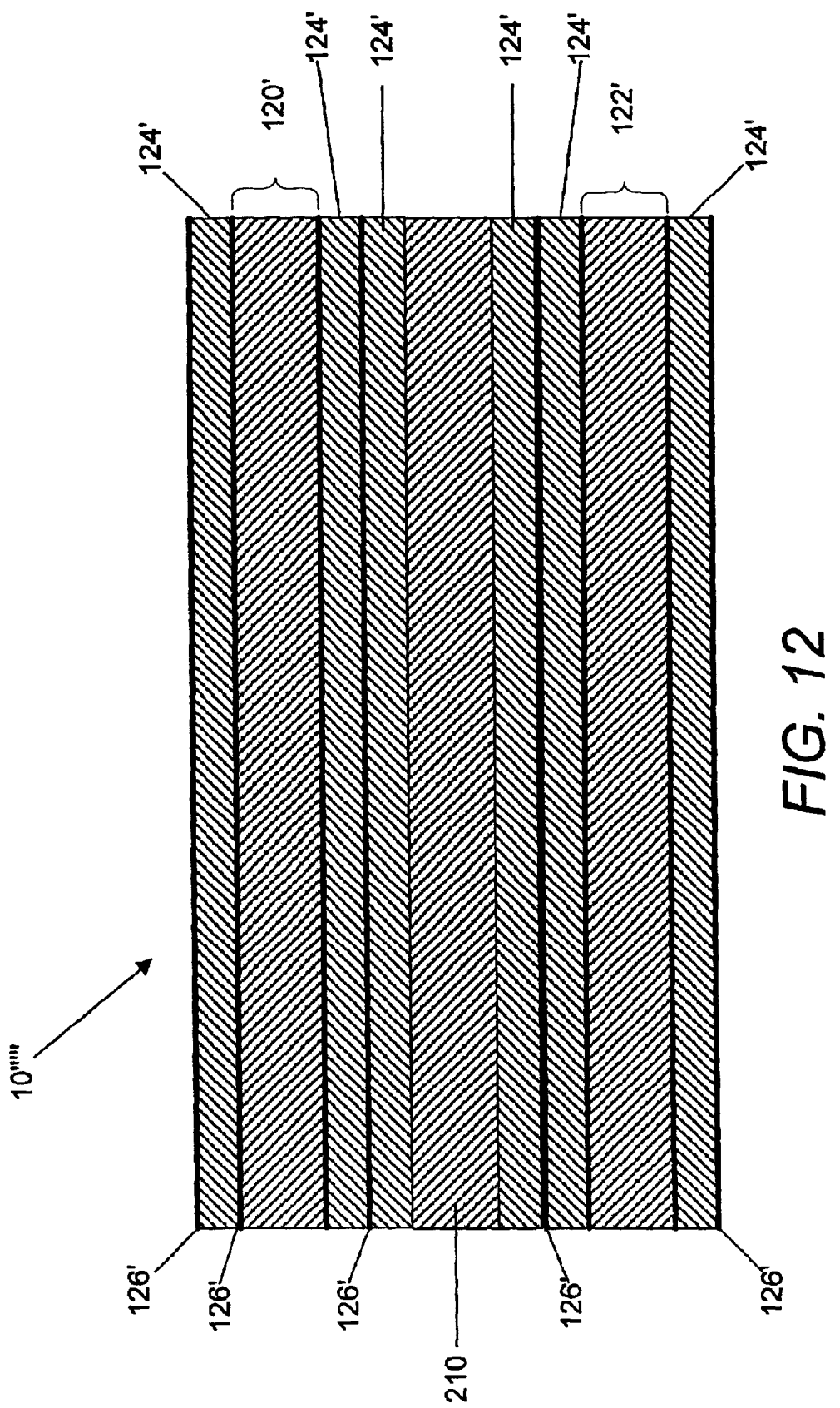
FIG. 12 is a semi-schematic cross-sectional view showing a PWB in accordance with the present invention including two electrically and thermally conductive laminates and an electrically isolated carbon support layer.

A PWB in accordance with the present invention incorporating laminates in accordance with the present invention and an additional carbon containing layer is illustrated in FIG. 12. The PWB 10"" has a first laminate 120', a second laminate 122', an additional carbon containing layer 210, prepreg layers 124' and layers of metal 126'. Preferably, the first laminate forms a ground plane and the second laminate forms a power plane. The additional carbon containing layer 210, does not act as a ground or power plane and is electrically isolated from the laminates and the layers of metal. The additional carbon containing layer increases the thermal conductivity and stiffness of the PWB and improves the CTE of the PWB. Similar materials to those used in the construction of the laminates, prepreg layers and layers of metal of the PWB 10 illustrated in FIG. 1 can also be used to construct the laminates, prepreg layers and layers of metal of the PWB 10"" illustrated in FIG. 12. The additional carbon containing layer can be constructed using the similar materials to those that can be used in the construction of the carbon containing layers of the laminates illustrated at 12 in FIG. 1, 12' in FIG. 3, 12" in FIG. 4, 12''' in FIGS. 5 and 12"" in FIG. 6.

The PWB 10"''' in FIG. 12 can be constructed using a processes similar to those described above in relation to FIGS. 11A–11C. The only difference is in the arrangement of the materials used in the construction of the third lamination cycle and the fact that filled clearance holes must also be drilled in the additional carbon containing layer 210 so that the additional carbon containing layer is electrically isolated from the linings of any through holes present in the PWB.

Although the embodiments described above have included a single or two laminates in accordance with the present invention, one skilled in the art would appreciate that a PWB can be constructed including three or more laminates using the processes described above.

What is claimed is:

1. A printed wiring board comprising:
   at least one carbon containing layer;
   at least one electrically conductive layer that includes at least one circuit;
   at least one dielectric layer located between the carbon containing layer and the electrically conductive layer; and
   wherein at least one electrical connection exists between the carbon containing layer and the circuit on the electrically conductive layer.

2. The printed wiring board of claim 1, wherein the carbon containing layer comprises a substrate containing carbon impregnated with a resin.

3. The printed wiring board of claim 2, wherein the substrate comprises woven carbon fibers.

4. The printed wiring board of claim 2, wherein the substrate comprises unidirectional carbon fibers.

5. The printed wiring board of claim 2, wherein the resin is an electrically conductive resin.

6. The printed wiring board of claim 5, wherein the electrically conductive resin has a dielectric constant greater than 6.0 at 1 MHz.

7. The printed wiring board of claim 5, wherein the electrically conductive resin contains a pyrolytic carbon additive.

8. The printed wiring board of claim 5, wherein the electrically conductive resin contains a silver oxide additive.

9. The printed wiring board of claim 5, wherein the electrically conductive resin contains carbon powder as an additive.

10. The printed wiring board of claim 5, wherein:
    the carbon containing layer is clad on at least one side with second electrically conductive layer; and
    an electrical connection between the carbon containing layer and the second electrically conductive layer is established by contact between the electrically conductive resin impregnated into the carbon substrate in the carbon containing layer and the second electrically conductive layer.

11. The printed wiring board of claim 1, wherein the carbon containing layer comprises a carbon plate.

12. The printed wiring board of claim 1, wherein the electrical connection includes a lined through hole.

13. The printed wiring board of claim 2, wherein:
    the carbon containing layer is clad on at least one side with second electrically conductive layer; and
    an electrical connection between the carbon containing layer and the second electrically conductive layer is established by contact between the carbon substrate in the carbon containing layer and the second electrically conductive layer.

14. The printed wiring board of claim 12, wherein the lining of the lined through hole contacts the carbon containing layer.

15. The printed wiring board of claim 12, wherein the lining of the lined through hole contacts the circuit on the electrically conductive layer.

* * * * *